United States Patent [19]
Davis et al.

[11] Patent Number: 5,343,055
[45] Date of Patent: Aug. 30, 1994

[54] AVALANCHE PHOTODIODE STRUCTURE WITH MG DOPING AND METHOD

[75] Inventors: Lynn Davis, Leeds; Myles MacBean, Stowmarket, both of England

[73] Assignee: British Telecommunications public limited company, London, England

[21] Appl. No.: 651,228

[22] PCT Filed: Jul. 27, 1989

[86] PCT No.: PCT/GB89/00855
§ 371 Date: Feb. 6, 1991
§ 102(e) Date: Feb. 6, 1991

[87] PCT Pub. No.: WO90/01217
PCT Pub. Date: Feb. 8, 1990

[30] Foreign Application Priority Data
Jul. 27, 1988 [GB] United Kingdom ............... 8817886

[51] Int. Cl.$^5$ ............................................. H01L 27/14
[52] U.S. Cl. ....................... 257/186; 257/438; 257/494; 437/3; 437/5; 437/75; 437/165; 437/167
[58] Field of Search ............... 357/30 A, 52, 52 D, 357/63, 16, 30 R, 90, 56; 437/904, 22, 5, 3, 74, 75, 165, 167, 151; 148/DIG. 70

[56] References Cited

U.S. PATENT DOCUMENTS

| | | | |
|---|---|---|---|
| 3,838,439 | 9/1974 | Biard ........................... | 257/462 |
| 4,126,930 | 11/1978 | Moon ........................... | 257/184 X |
| 4,525,429 | 6/1985 | Kaiser et al. ............... | 357/63 X |
| 4,564,720 | 1/1986 | Hogan ........................ | 257/461 X |
| 4,629,519 | 12/1986 | van Oirschot ............. | 437/92 |
| 4,819,039 | 4/1989 | Chi et al. .................... | 357/30 A X |
| 4,840,916 | 6/1989 | Yasuda et al. ............. | 357/30 A X |
| 4,949,144 | 8/1990 | Kuroda et al. ............. | 357/52 X |
| 4,974,061 | 11/1990 | Torikai ........................ | 357/30 A X |
| 4,992,386 | 2/1991 | Furuyama et al. ........ | 437/3 |
| 5,114,866 | 5/1992 | Ito et al. ..................... | 437/3 |
| 5,144,381 | 9/1992 | Furuyama et al. ........ | 257/186 |
| 5,157,473 | 10/1992 | Okazaki .................... | 257/438 |

FOREIGN PATENT DOCUMENTS

| | | | |
|---|---|---|---|
| 0216572 | 4/1987 | European Pat. Off. . | |
| 62-205673 | 3/1986 | Japan . | |
| 63-211619 | 9/1988 | Japan ........................ | 437/5 |
| 1184962 | 7/1989 | Japan ........................ | 357/30 A |

OTHER PUBLICATIONS

Lewis et al., "Magnesium Doping of Efficient GaAs and Ga$_{0.75}$In$_{0.25}$As Solar Cells Grown by Metalorganic Chemical Vapor Deposition," *Appl. Phys. Lett.* 45(8) Oct. 15, 1984, pp. 895–897.

Olson et al., "GaInP$_2$/GaAs Monolithic Tandem Solar Cells," *IEEE Photovoltaic Specialists Conference—1987*, New Orleans, USA, May 4–8, 1987, pp. 284–288–A.

Zuleeg, "Responsibility of Ion–Implanted P–N Junction in a GaAs Electroabsorption Avalanche Detector", *IEEE Transactions on Electron Devices*, vol. ED-33, No. 6, Jun. 1986, pp. 799–801.

*Primary Examiner*—William Mintel
*Attorney, Agent, or Firm*—Nixon & Vanderhye

[57] ABSTRACT

An avalanche photodiode structure has a graded magnesium guard ring formed by diffusion from an organic-metallic source. Suitably masked APD layers are placed in an open flow reactor and heated while bis (cyclopentadienyl) magnesium vapor is flowed over the APD layers. Hydrogen and group V precursors are passed simultaneously with the bis (cyclopentadienyl) magnesium vapor to prevent loss of group V elements from the surface of the device.

8 Claims, 3 Drawing Sheets

AVALANCHE PHOTODIODE STRUCTURE WITH MG DOPING AND METHOD

BACKGROUND OF THE INVENTION

1. Field of the Invention

This invention relates to avalanche photodiodes and fabrication thereof.

2. Description of the Related Art

In avalanche photodiodes (APDs) photo-carrier density is multiplied by impact ionisation of photogenerated carriers accelerated by a high field. In III–V APD devices for use at wavelengths of 1.3 and 1.5 microns a material such as indium gallium arsenide is used for the region where photogeneration occurs. If the multiplication also takes place in this material, which has a comparatively small band gap, high dark currents resulting from tunnelling occur at the high fields required for multiplication, giving rise to excessive noise. To avoid this problem the holes are photogenerated in indium gallium arsenide and swept into a wider band gap indium phosphide layer containing the pn junction where avalanche multiplication then takes place. This type of device is known as the separate absorption and multiplication (SAM) structure and is well known. The thickness and doping level of the indium phosphide multiplication layer has to be carefully con, rolled in order to achieve the correct field for avalanche multiplication near the pn Junction with a sufficiently low field at the interface with the indium gallium arsenide layer to avoid tunnelling. Both planar and mesa APD structures are known, and in general planar structures have provided superior stability and reliability. In planar devices the pn junction is of necessity curved, and, in order to prevent edge breakdown at the curved edge a p type guard ring is provided around the active part of the device, and it is necessary to carefully control the distribution of the p type dopant in the guard ring.

Various growth methods such as LPE, MOVPE and VPE are available to obtain, in a controlled manner, the layer thicknesses that APD device layers require. Dopants are subsequently diffused or ion implanted into the layers. However, diffusion techniques tend to suffer from lack of reproducibility and flexibility due to the difficulty in achieving exact control over the dopant vapor concentration while implantation techniques require complex and expensive equipment. Also, in the case of sealed ampoule diffusion, for example, the size of the sample that can be processed is limited by the apparatus, such as the maximum practical size of the ampoule.

SUMMARY OF THE INVENTION

The present invention is directed towards overcoming the above problems and provides a new diffusion technique.

Accordingly the present invention provides an avalanche photodiode comprising a semiconductor substrate, an n type light absorption layer, an n type multiplication layer, a p type region formed on the multiplication layer and providing an abrupt pn junction with the multiplication layer and a graded p type guard ring surrounding said p type region, characterised in that the guard ring comprises magnesium dopant and is formed by diffusion from a metal-organic vapor magnesium diffusion source.

The invention also provides a method of making avalanche photodiodes comprising growing a light absorption layer and a multiplication layer by metal organic vapor phase epitaxy and subsequently forming structures therein by dopant diffusion from gaseous metal-organic compounds.

Another aspect of the invention provides a method of forming a guard ring of magnesium by diffusion from a vapor-metal-organic magnesium source.

BRIEF DESCRIPTION OF THE DRAWINGS

The invention will now be described by way of example only with reference to the accompanying drawings in which.

DESCRIPTION OF THE PREFERRED EMBODIMENTS

Figure 1:
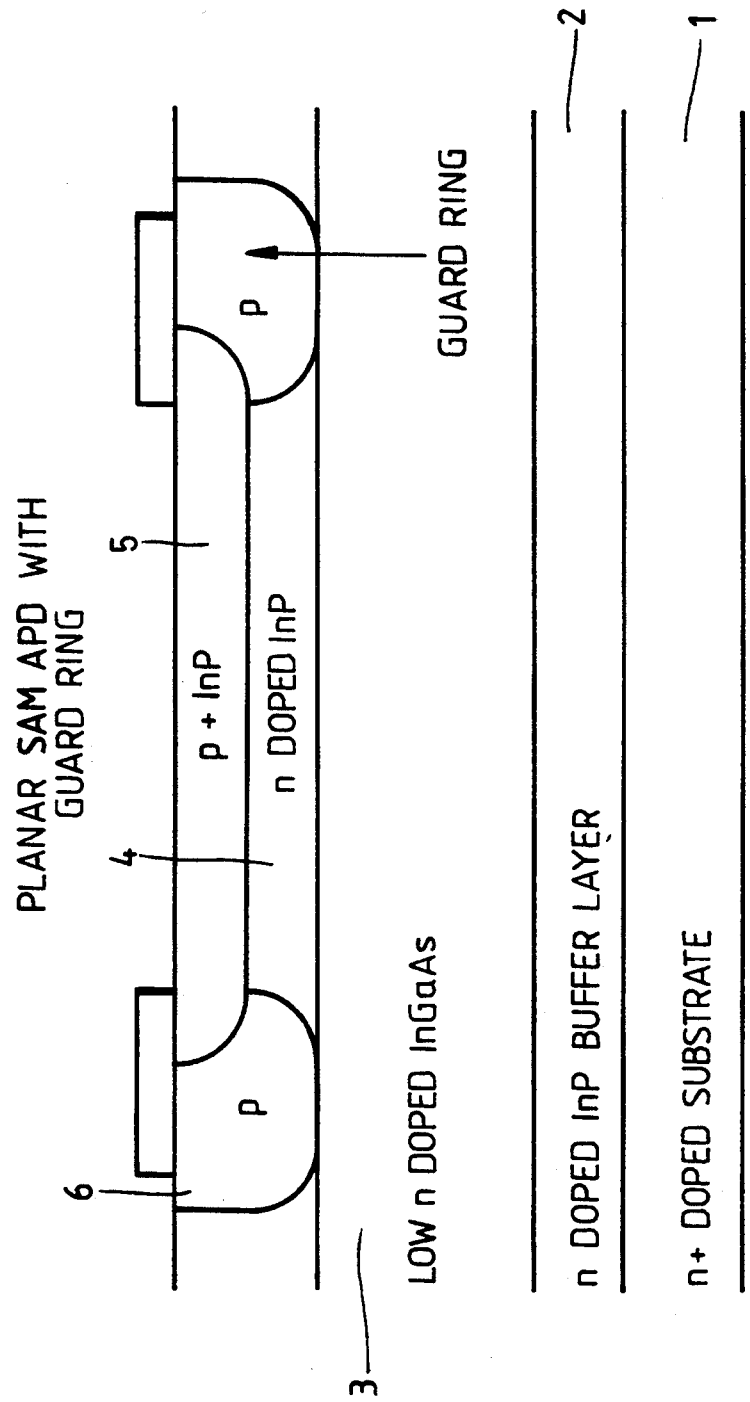
FIG. 1 is a schematic diagram of a cross section through an APD according to the invention.

Referring to FIG. 1, a preferred planar SAM APD structure is shown. The device comprises an n+ indium phosphide substrate 1, doped for example with sulphur to a level of $8 \times 10^{18}$ per cubic centimeter. Over the substrate there is a 0.5 micron n type indium phosphide buffer layer 2, doped for example to a level of $10^{17}$ per cubic centimeter, a 3 micron layer of nominally undoped indium gallium arsenide 3 (which in fact has a residual doping level of n type $10^{15}$ per cubic centimeter), a 3 micron n type layer of indium phosphide 4 into which is diffused through a mask a 2 micron zinc doped p+ type indium phosphide layer 5. A p type guard ring 6 surrounds the indium phosphide pn junction layers 4,5. Light incident on this device passes through the wider band gap indium phosphide, photogeneration takes place in the indium gallium arsenide layer 3 and the holes are swept by the field of the pn junction into the indium phosphide layer 4 where avalanche multiplication and collection takes place at the pn junction.

Between the indium gallium arsenide layer 3 and n type indium phosphide layer 4 there is an interface region of about 1/10 micron of chirped super lattice in which the band gap changes from that of indium gallium arsenide to that of indium phosphide: an alternative to this is to have a grading layer of an undoped quaternary material. The indium phosphide layer 4 may be graded step wise or smoothly, from nominally undoped at the top surface to 2 to $3 \times 10^{16}$ per cubic centimeter at the pn junction where higher fields are required. This improves operation of the guard ring.

Figure 2:
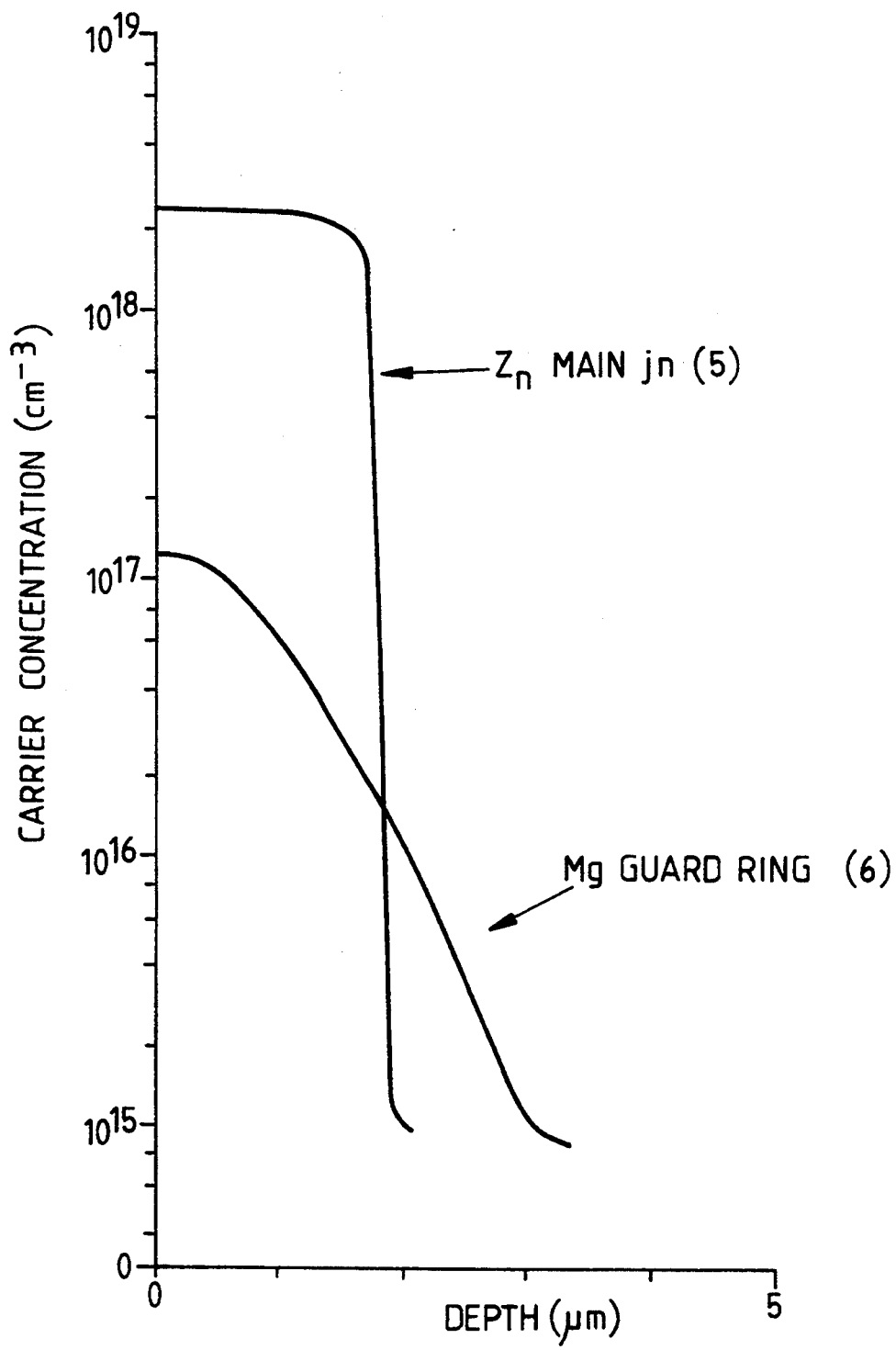
FIG.2 is a plot of carrier concentration against depth beneath the surface of the APD of FIG. 1.

The p type guard ring 6 preferably has a graded profile from a surface concentration of $10^{17}$ per cubic centimeter and reducing with depth, as shown in FIG. 2. The depth of the guard ring is generally about 2.5 microns although the influence extends more deeply. Guard rings have been fabricated by ion implantation of beryllium, but that procedure (followed by the necessary annealing) is complex and has associated health hazards from beryllia dust. A diffused zinc junction can be formed but the diffusion properties of zinc are such that to obtain a graded junction diffusion over an extended period of days, or even weeks is necessary. In the invention it has been found particularly preferable to use magnesium, introduced by the diffusion technique described hereinafter, and this provides a good guard ring that has the desired concentration profile.

The diffusion coefficient of magnesium is relatively low so the guard ring undergoes minimal change during a subsequent heating cycle for diffusion of the p+ layer 5. A typical carrier concentration profile resulting from the zinc diffusion for p+ layer 5 is shown in FIG. 2.

Magnesium is a difficult dopant to incorporate. Inclusion has been attempted in liquid phase epitaxial growth but the magnesium would not mix in the melt. Moreover, even if epitaxial growth of magnesium doped semiconductor were trivial, there would be enormous practical disadvantages to growing a guard ring structure by epitaxy. In other diffusion processes there are likely to be oxidation problems. Consequently, ion beam implantation has, until now, been the only practical method of producing magnesium dope guard rings.

Figure 3:
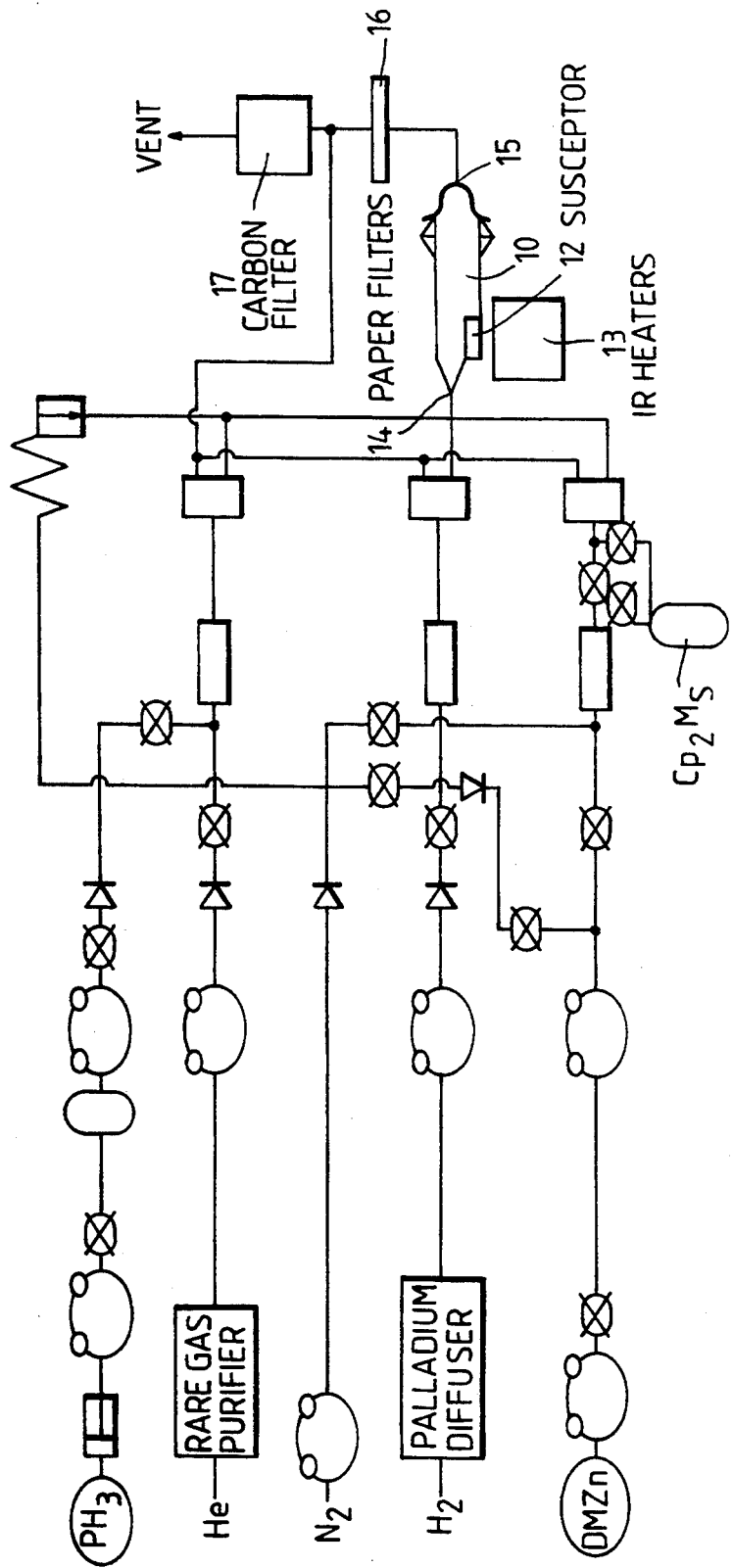
FIG. 3 is a schematic diagram of a MOVPE diffusion system for use in accordance with the invention.

Turning now to the process for diffusion of the p type layers, FIG. 3 shows a suitable apparatus and comprises a horizontal, cold walled MOVPE reactor 10 in which a sample is located on a graphite susceptor 12 that is heated from beneath by infra red quartz lamps 13. Gases of the required mixture are introduced to the reactor at inlet 14, pass over the heated sample and flow out via outlet 15 and through paper and carbon filters 16, 17 to waste.

The vapor flow differs from the usual flow in MOVPE growth, which contains beth group III and group V precursors, in that group III precursors are omitted and the flow consists of group V precursors which protect the surface integrity of the sample and a dopant source. The same kit is used for both diffusion of zinc for the p layer 5 and also for the magnesium diffusion of the guard ring, the latter diffusion being performed first at a higher temperature. Standard masking techniques are used to protect the surface in areas into which diffusion is not required and initially the surface of the sample is left exposed only at the surface location of the guard ring. This masked sample is placed on the susceptor 2 in the MOVPE reactor and the system is flushed with hydrogen and at the commencement of heating the sample, 5% phosphine in hydrogen is introduced into the hydrogen flow to prevent loss of phosphorus from the sample surface. The sample is heated to 660° C. and a molar flow of $2 \times 10^{-6}$ moles per minute of Cp2Mg is introduced to the flow and these conditions maintained for 64 minutes while the magnesium diffusion takes place. The Cp2Mg flow is then turned off and the sample cooled while the phosphine/hydrogen flow is maintained. At 250° C. the phosphine is sucked out and then at room temperature the system is flushed with nitrogen before opening to remove the sample.

The sample mask is removed, a mask defining the central p type area applied and the sample replaced in the reactor. Diffusion of zinc to form the central p type region is then conducted, the sample temperature being 550° C. and the dopant source dimethyl zinc in hydrogen at a flow rate of $4 \times 10^{-6}$ moles per minute for 22 minutes.

For the magnesium diffusion the 5% PH in hydrogen flow rate required to protect the sample surface is 300 sccm, while in the zinc diffusion stage it is 250 sccm.

Diffusion times and temperatures maybe varied from those given above, and dopants other than zinc may be used for the p layer 5.

An APD device was fabricated using the technique described above with a 2 micron deep guard ring of magnesium formed by diffusion at 660° C. for 64 minutes. The breakdown voltages of the magnesium guard ring alone, zinc main junction alone and full structure were measured. These were found to be: guard ring breakdown of the order of 60 volts; main junction breakdown of the order of 40 volts; full structure breakdown of the order of 40 volts.

The technique described enables formation of a graded junction by relatively fast diffusion, that is diffusion that can be completed in minutes to hours rather than days to weeks. With ion implantation the equivalent process would be costly and the grading and abruptness is largely material independent.

We claim:

1. A method of making avalanche photodiodes comprising growing a light absorption layer and a multiplication layer by metal organic vapor phase epitaxy and subsequently forming a magnesium doped guard ring structure therein by dopant diffusion from a metal-organic vapor magnesium diffusion source.

2. A method according to claim 1 in which a magnesium doped guard ring structure is defined by flowing bis (cyclopentadienyl) magnesium vapor over the MOVPE grown layers in an open flow reactor.

3. A method of forming in a semiconductor device a guard ring by diffusing a magnesium dopant from a vapor metal-organic magnesium source.

4. A method according to claim 3 in which the guard ring is formed on an avalanche photodiode structure comprising an n type light absorption layer, an n type multiplication layer adjacent said absorption layer, a p type region formed on the multiplication layer and providing an abrupt pn junction with the multiplication layer, the guard ring surrounding the p type region and being formed by flowing bis (cyclopentadienyl) magnesium vapor over the avalanche photodiode structure which has been masked to define the guard ring structure.

5. A method according to claim 4 in which the multiplication layer is a group III-V semiconductor and the bis (cyclopentadienyl) magnesium vapor is flowed over the masked photodiode structure in the presence of hydrogen and a group V precursor, and the avalanche photodiode structure is simultaneously heated.

6. A method of making semiconductor devices having embolded magnesium-doped structures in a metal organic vapor phase epitaxy (MOVPE) reactor, said method comprising the steps of:

growing successive doped epitaxial semiconductor layers using MOVPE in said MOVPE reactor;

selectively masking a selected area of a top epitaxial semiconductor layer to leave a selected exposed area;

diffusing a magnesium dopant into said exposed top epitaxial layer areas by flowing a magnesium-containing vapor over said exposed areas within said MOVPE reactor thereby forming a three-dimensional magnesium-doped structure within the top epitaxial semiconductor layer.

7. A method as in claim 6 wherein said successive epitaxial semiconductor layers define an avalanche photodiode structure and the exposed area defines the location of at least one guard ring structure containing the diffused magnesium dopant.

8. A method as in claim 6 wherein said diffusing step comprises heating of said semiconductor layers in the MOVPE reactor during said flowing of a magnesium-containing vapor.

* * * * *